(12) United States Patent
Jang et al.

(10) Patent No.: US 7,972,930 B2
(45) Date of Patent: Jul. 5, 2011

(54) TRANSISTOR AND METHOD OF MANUFACTURING THE SAME

(75) Inventors: Jae-Eun Jang, Yongin-si (KR);
Seung-Nam Cha, Yongin-si (KR);
Jae-Eun Jung, Yongin-si (KR);
Yong-Wan Jin, Yongin-si (KR)

(73) Assignee: Samsung Mobile Display Co., Ltd., Giheung-Gu, Yongin, Gyunggi-Do (KR)

( * ) Notice: Subject to any disclaimer, the term of this patent is extended or adjusted under 35 U.S.C. 154(b) by 354 days.

(21) Appl. No.: 11/987,250

(22) Filed: Nov. 28, 2007

(65) Prior Publication Data

US 2008/0230853 A1 Sep. 25, 2008

(30) Foreign Application Priority Data

Mar. 21, 2007 (KR) .................. 10-2007-0027815

(51) Int. Cl.
*H01L 21/336* (2006.01)

(52) U.S. Cl. .......... 438/284; 438/286; 438/53; 257/401; 257/419; 977/762

(58) Field of Classification Search .................. 257/401, 257/419, E21.409, E29.255; 977/762; 438/284, 438/286, 53
See application file for complete search history.

(56) References Cited

U.S. PATENT DOCUMENTS

| 7,709,827 | B2 * | 5/2010 | Graham et al. | 257/24 |
| 7,714,386 | B2 * | 5/2010 | Pesetski et al. | 257/347 |
| 2005/0136585 | A1 * | 6/2005 | Chau et al. | 438/214 |

\* cited by examiner

*Primary Examiner* — Thinh T Nguyen
(74) *Attorney, Agent, or Firm* — Robert E. Bushnell, Esq.

(57) ABSTRACT

In a transistor and a method of manufacturing the same, the transistor includes a channel layer arranged on a substrate, a source electrode and a drain electrode formed on the substrate so as to contact respective ends of the channel layer, a gate insulating layer surrounding the channel layer between the source electrode and the drain electrode, and a gate electrode surrounding the gate insulating layer.

19 Claims, 12 Drawing Sheets

TRANSISTOR AND METHOD OF MANUFACTURING THE SAME

CLAIM OF PRIORITY

This application makes reference to, incorporates the same herein, and claims all benefits accruing under 35 U.S.C. §119 from an application for TRANSISTOR AND METHOD OF MANUFACTURING THE SAME earlier filed in the Korean Intellectual Property Office on the 21$^{st}$ of Mar. 2007 and there duly assigned Serial No. 10-2007-0027815.

BACKGROUND OF THE INVENTION

1. Technical Field

The present invention relates to a semiconductor device and a method of manufacturing the semiconductor device and, more particularly, to a transistor having a cylinder type gate and a method of manufacturing the transistor.

2. Related Art

Thin film transistors (TFTs) are used as switching devices in flat panel display apparatuses such as liquid crystal display devices (LCDs) or organic light emitting display devices (OLEDs). Mobility or leakage current, by which the performance of the thin film transistors is evaluated, is greatly affected by the material and state of a channel layer through which charge carriers travel.

In commercially produced liquid crystal display devices, a channel layer of a thin film transistor comprises mainly amorphous silicon. When the channel layer of the thin film transistor comprises mainly amorphous silicon, charge mobility is about 0.5 cm$^2$/Vs, which is very low, and thus it is difficult to increase the operating speed of such liquid crystal display devices.

Thus, a nano-wire transistor with a channel layer formed of a single-crystal semiconductor, and having a greater charge mobility than a channel layer formed of amorphous silicon, has been suggested.

In a nano-wire transistor, a gate electrode is formed on a substrate, and a gate insulating layer is formed on the substrate to cover the gate electrode. A plurality of channel layers, formed of a single crystal semiconductor on another substrate using a single crystal growth method and then cut, having a cylindrical shape are arranged on the gate insulating layer. A source electrode covering an end of the channel layers and a drain electrode covering another end of the channel layers are formed on the gate insulating layer.

As the channel layers of the nano-wire transistor are formed of a single crystal semiconductor, the charge mobility of the nano-wire transistor is excellent.

However, the channel layers are arranged in a multi-layer structure, and a gate electric field cannot be uniformly applied to the entire region of the channel layers. The portions of the channel layers near the gate electrode are more affected by the gate electric field than the portions of the channel layers far from the gate electrode. Thus not all of the channel layers can be uniformly turned on or turned off. Accordingly, it is difficult to realize a transistor having good switching characteristics.

SUMMARY OF THE INVENTION

The present invention provides a transistor having a channel layer which is formed of a single crystal material with high charge mobility, wherein a gate electric field can be uniformly applied to the channel layer to provide good switching characteristics.

The present invention also provides a method of manufacturing the transistor.

According to an aspect of the present invention, a transistor comprises: a channel layer arranged on a substrate; a source electrode and a drain electrode formed on the substrate so as to respectively contact both ends of the channel layer; a gate insulating layer surrounding the channel layer between the source electrode and the drain electrode; and a gate electrode surrounding the gate insulating layer.

The substrate maybe a glass substrate, a plastic substrate, or a semiconductor substrate.

The channel layer may have a single crystal structure.

The channel layer may be a carbon nano tube (CNT) layer, a Si layer, a ZnO layer, a GaN layer, a GaP layer, or an InP layer.

The channel layer may be cylindrical, hexagonal or planar.

A plurality of channel layers identical to the channel layer may be arranged on the substrate.

The channel layers may be arranged on the substrate in a single-layer structure or in a multi-layer structure.

The gate insulating layer may be a SiO$_x$ layer or a Si$_x$N$_y$ layer, or a material layer having a greater dielectric constant than a Si$_x$N$_y$ layer.

The transistor may further comprise a contact electrode contacting the gate electrode.

The contact electrode may be formed on or under the gate electrode.

According to another aspect of the present invention, a method of manufacturing a transistor comprises the steps of: forming a vertical channel layer on a first substrate; sequentially forming a gate insulating layer and a gate electrode on a surface of the vertical channel layer so as to form a vertical structure comprising the vertical channel layer, the gate insulating layer, and the gate electrode; separating the vertical structure from the first substrate; laying the vertical structure lengthwise on a second substrate forming a mask layer exposing both ends of the vertical structure on the second substrate; sequentially removing portions of the gate electrode and the gate insulating layer from both ends of the exposed vertical structure; and forming a source electrode and a drain electrode respectively contacting both ends of the vertical structure.

The first substrate may be a semiconductor substrate having a single crystal structure.

The vertical channel layer may be formed by etching the first substrate.

The vertical channel layer may be formed using a single crystal growth method.

The vertical channel layer may be a carbon nano tube (CNT) layer, a Si layer, a ZnO layer, a GaN layer, a GaP layer, or an InP layer.

The channel layer may be cylindrical, hexagonal, or planar.

A plurality of vertical layers identical to the vertical layer may be formed, and the gate insulating layer and the gate electrode may sequentially surround the vertical channel layers.

The method may further comprise the step of reducing the diameter or thickness of the vertical channel layer before forming the gate insulating layer.

The step of reducing the diameter or thickness of the vertical channel layer may comprise: forming an oxide layer by oxidizing a surface of the vertical channel layer; and removing the oxide layer.

The gate insulating layer may be formed of SiO$_x$ or Si$_x$N$_y$, or a material having a greater dielectric constant than Si$_x$N$_y$.

The second substrate may be a glass substrate, a plastic substrate, or a semiconductor substrate.

A plurality of vertical structures identical to the vertical structure may be laid on the second substrate.

The vertical structures may be arranged on the second substrate in a single layer or a multi-layer structure.

When removing the gate electrode from both ends of the vertical structure, a portion of the gate electrode under the mask layer may be under-cut.

The step of forming the source electrode and the drain electrode may comprise: forming a source/drain electrode layer on the second substrate and the mask layer so as to cover both ends of the vertical structure; and removing the mask layer and the source/drain electrode layer on the mask layer.

The step of forming the source electrode and the drain electrode may comprise: forming a source/drain electrode layer on the second substrate and the mask layer so as to cover both ends of the vertical structure; polishing the source/drain electrode layer until the mask layer is exposed; and removing the mask layer.

A contact electrode contacting the gate electrode may be further formed on the second substrate.

The contact electrode may be formed on the gate electrode.

The contact electrode may be formed under the gate electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

The present invention will now be described more fully with reference to the accompanying drawings, in which exemplary embodiments of the invention are shown. The widths and thicknesses of layers or regions illustrated in the drawings are exaggerated for clarity. Like reference numerals in the drawings denote like elements.

Figure 1:
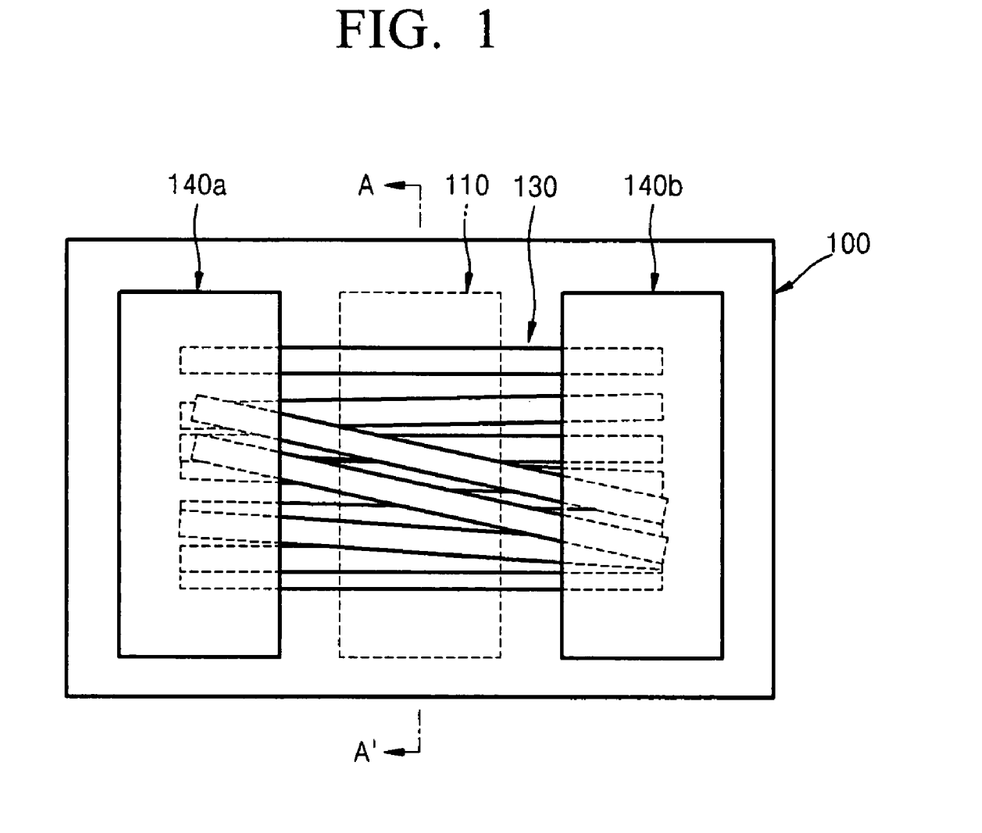
FIG. 1 is a plan view of a nano-wire transistor.
Figure 2:
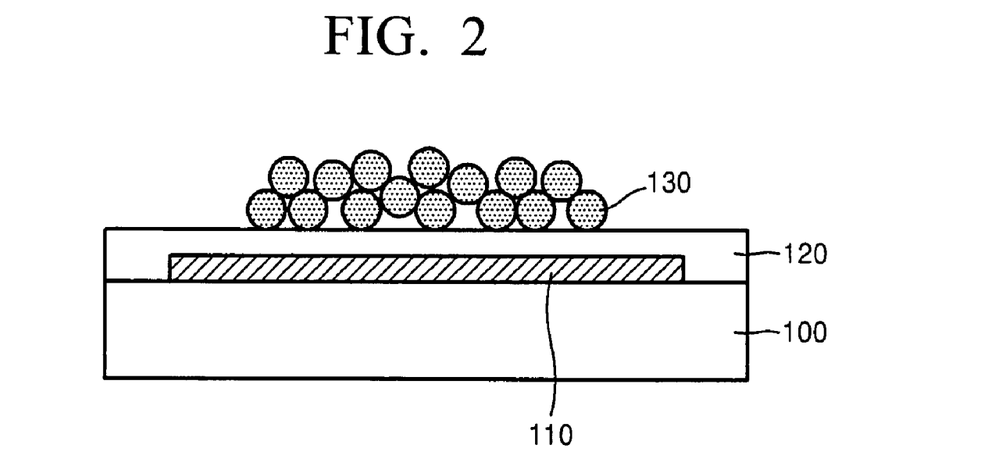
FIG. 2 is a cross-sectional view of the nano-wire transistor of FIG. 1 taken along a line A-A'.

FIG. 1 is a plan view of a nano-wire transistor, and FIG. 2 is a cross-sectional view of the nano-wire transistor of FIG. 1 taken along a line A-A'.

Referring to FIGS. 1 and 2, a gate electrode 110 is formed on a substrate 100, and a gate insulating layer 120 is formed on the substrate 100 so as to cover the gate electrode 110. A plurality of channel layers 130, formed of a single crystal semiconductor on another substrate using a single crystal growth method and then cut, and having a cylindrical shape, are arranged on the gate insulating layer 120. A source electrode 140a covering the ends of the channel layers 130, and a drain electrode 140b covering another end of the channel layers 130, are formed on the gate insulating layer 120.

As the channel layers 130 of the nano-wire transistor illustrated in FIGS. 1 and 2 are formed of a single crystal semiconductor, the charge mobility of the nano-wire transistor is excellent.

Figure 3:
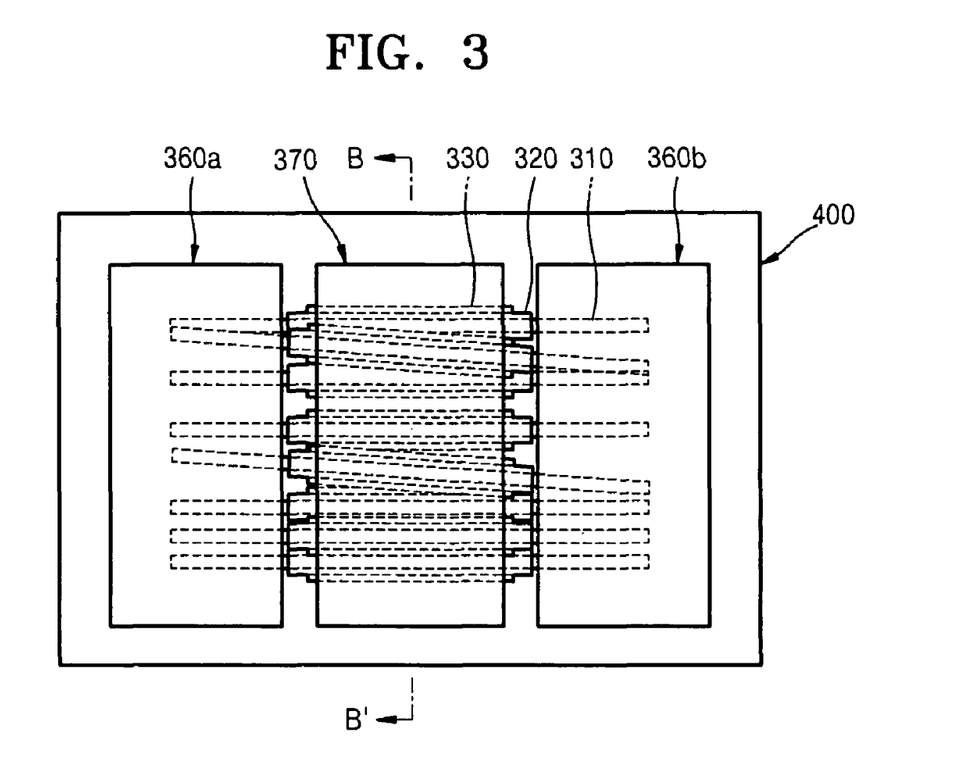
FIG. 3 is a plan view of a transistor according to an embodiment of the present invention.
Figure 4:
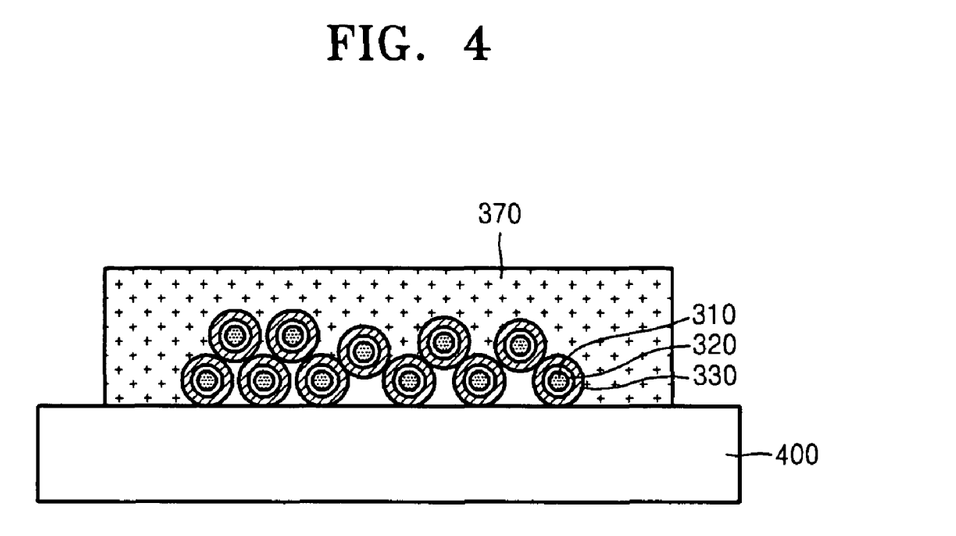
FIG. 4 is a cross-sectional view of the transistor of FIG. 3 taken along a line B-B', according to an embodiment of the present invention.

FIG. 3 is a plan view of a transistor according to an embodiment of the present invention, and FIG. 4 is a cross-sectional view of the transistor of FIG. 3 taken along a line B-B'.

Referring to FIGS. 3 and 4, a plurality of channel layers 310 are arranged on a substrate 400. The substrate 400 is preferably a glass substrate or a plastic substrate, but may also be a semiconductor substrate, such as a silicon substrate, according to circumstances. The channel layers 310 are single crystal layers, and may be carbon nano tube (CNT) layers, Si layers, ZnO layers, GaN layers, GaP layers or InP layers. The channel layers 310 are cylindrical in shape according to the current embodiment of the present invention, but the present invention is not limited thereto, and the channel layers 310 may also be hexagonal or planar. The channel layers 310 may be arranged in a multi-layer structure on the substrate 400, but may also be arranged in a single layer.

A source electrode 360a covering an end of the channel layers 310 and a drain electrode 360b covering another end of the channel layers 310 are formed on the substrate 400. Each of the channel layers 310 between the source electrode 360a and the drain electrode 360b is respectively surrounded by a gate insulating layer 320. The gate insulating layer 320 may be a $SiO_x$ layer, a $Si_xN_y$ layer, or a high-k dielectric material layer having a greater dielectric constant than a $Si_xN_y$ layer, for example, $Ta_2O_5$, BST, or PZT. Each gate insulating layer 320 is surrounded by a gate electrode 330. In other words, the portion of each of the channel layers 310 between the source and drain electrodes 360a and 360b, respectively, is double-coated by a gate insulating layer 320 and a gate electrode 330. The gate electrodes 330 are separated from the source electrode 360a and the drain electrode 360b.

The transistor according to the current embodiment of the present invention may further include a contact electrode 370 contacting the gate electrodes 330. The contact electrode 370 may be formed on the substrate 400 so as to cover the gate electrodes 330 as illustrated in FIGS. 3 and 4, but may also be formed below the gate electrodes 330.

As described above, each of the channel layers 310 between the source and drain electrodes 360a and 360b, respectively, in the transistor according to the current embodiment of the present invention is sequentially surrounded by a gate insulating layer 320 and a gate electrode 330. The gate electrodes 330 of adjacent channel layers 310 contact one another, and each gate electrode 330 contacts the contact electrode 370. Accordingly, a uniform gate electric field can be applied to each of the channel layers 310, and thus the channel layers 310 can be simultaneously turned on. In the case of the transistor illustrated in FIG. 2, the volume of effective channels is small because the contact area between the channel layers 130 and the gate electrode 110, having the gate insulating layer 120 interposed therebetween, is small. However, in the transistor illustrated in FIG. 4 according to the current embodiment of the present invention, each of the channel layers 310 is surrounded by a gate electrode 330, and thus the volume of effective channels is relatively high. Accordingly, according to the present invention, a transistor having good switching characteristic can be realized.

Figure 5A:
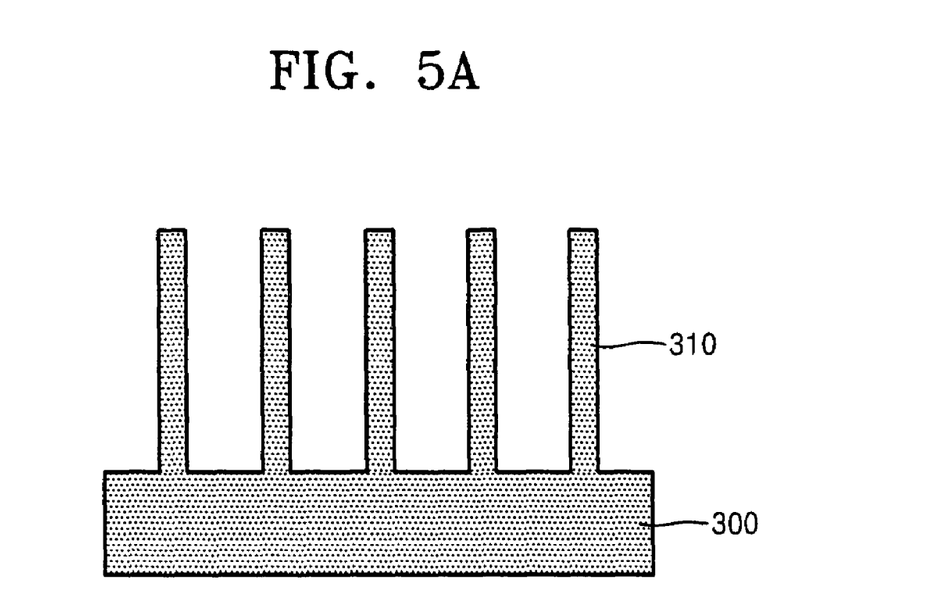
FIGS. 5A thru 5N illustrate a method of manufacturing a transistor according to an embodiment of the present invention.
Figure 5B:
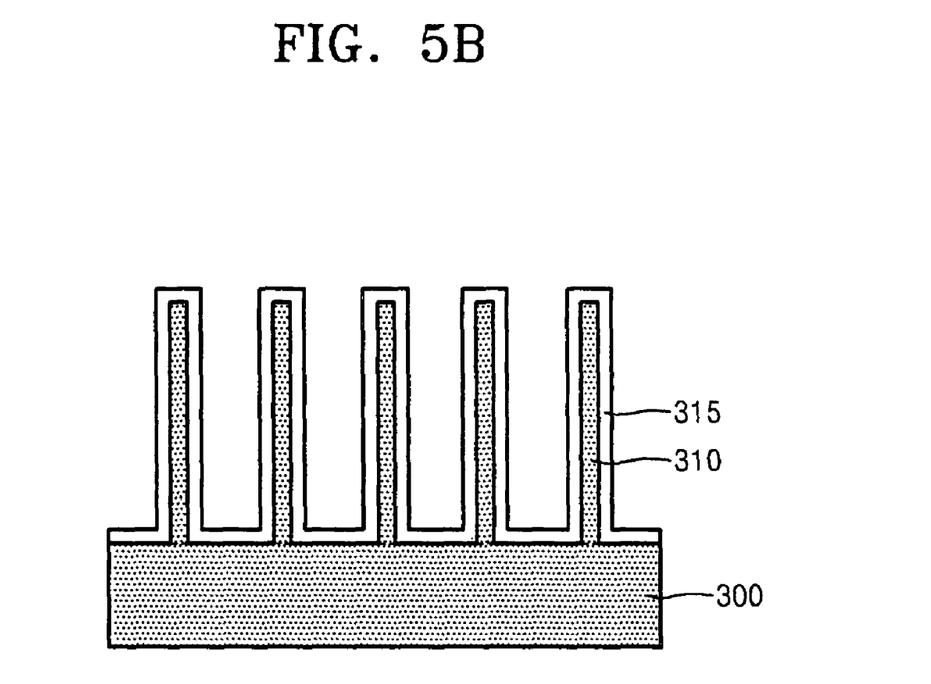
Figure 5C:
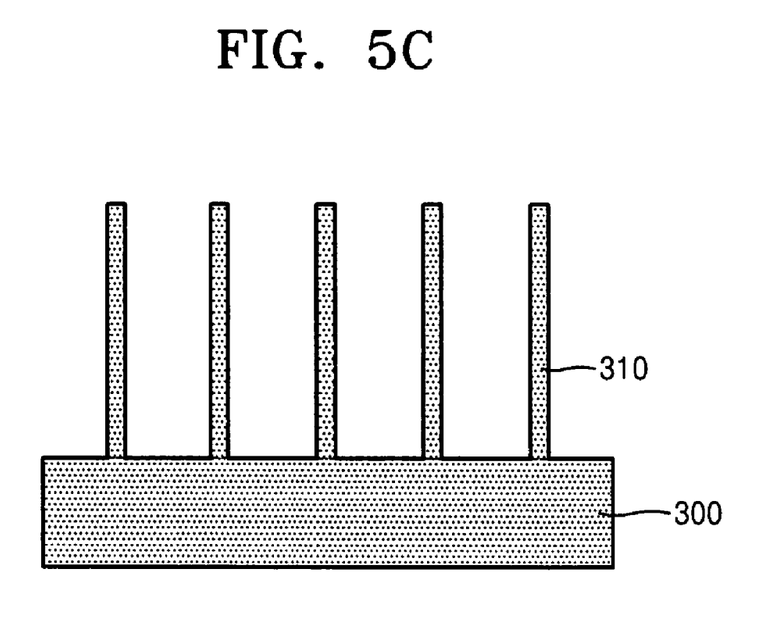
Figure 5D:
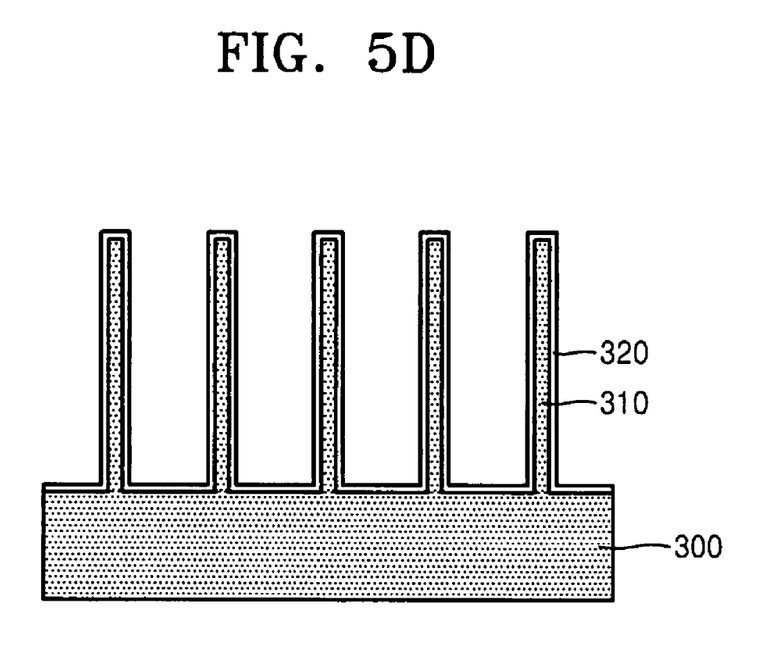
Figure 5E:
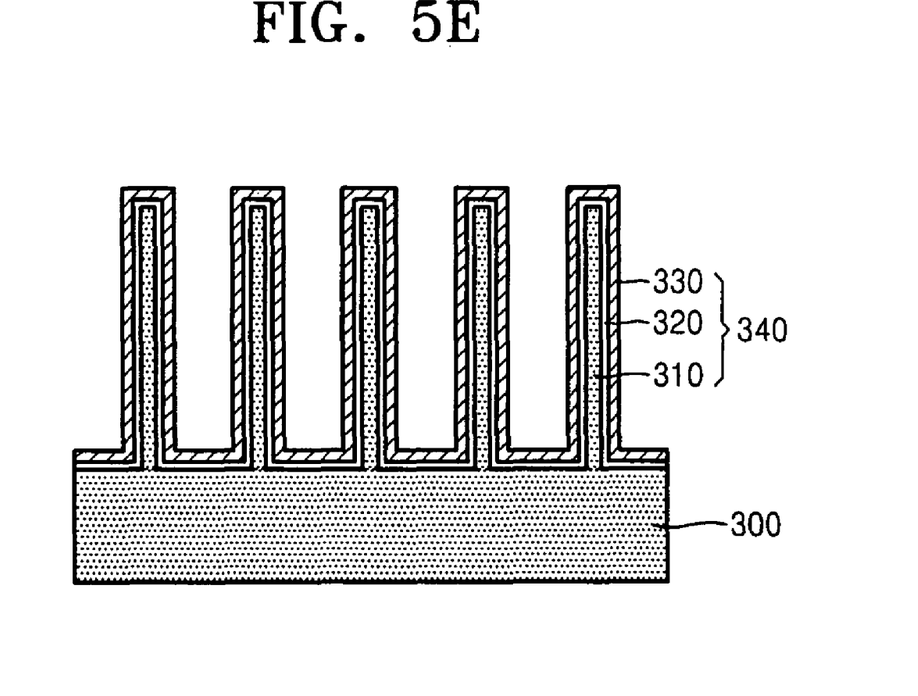
Figure 5F:
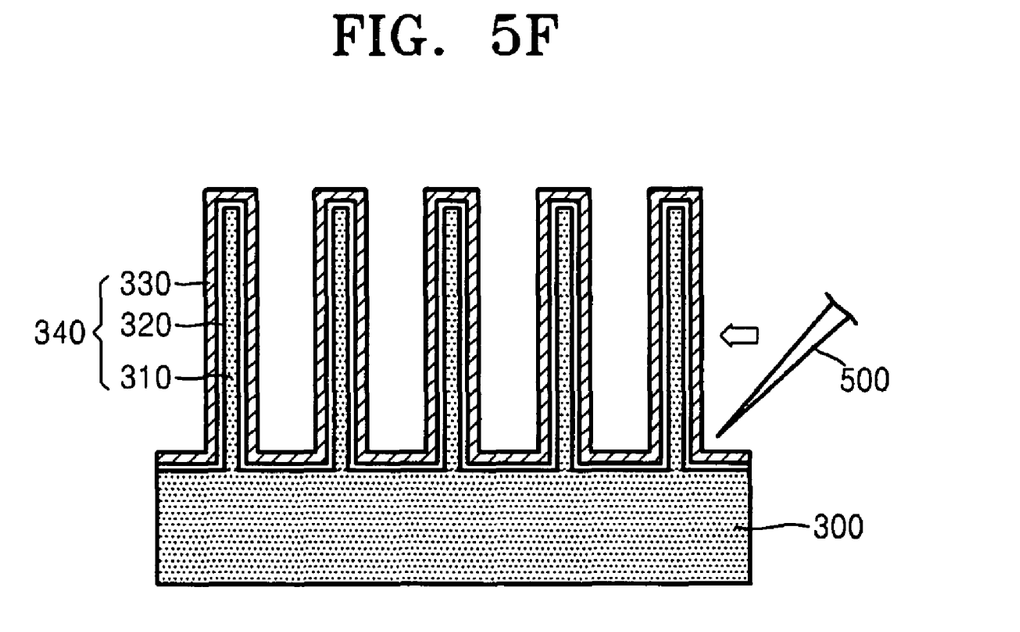
Figure 5G:
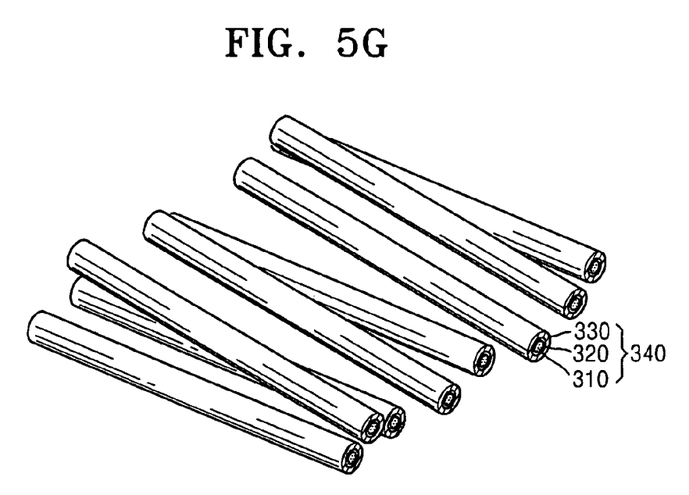
Figure 5H:
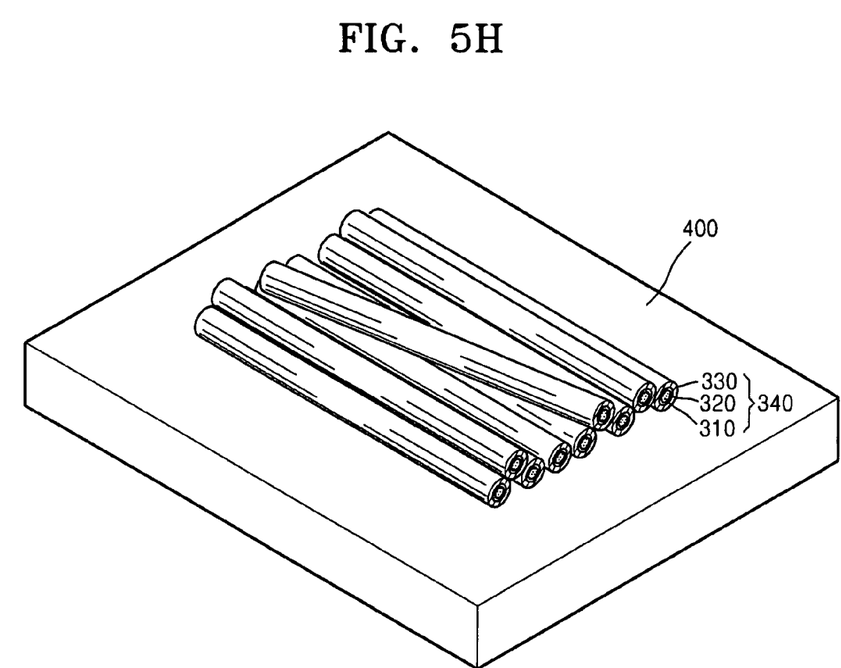
Figure 5I:
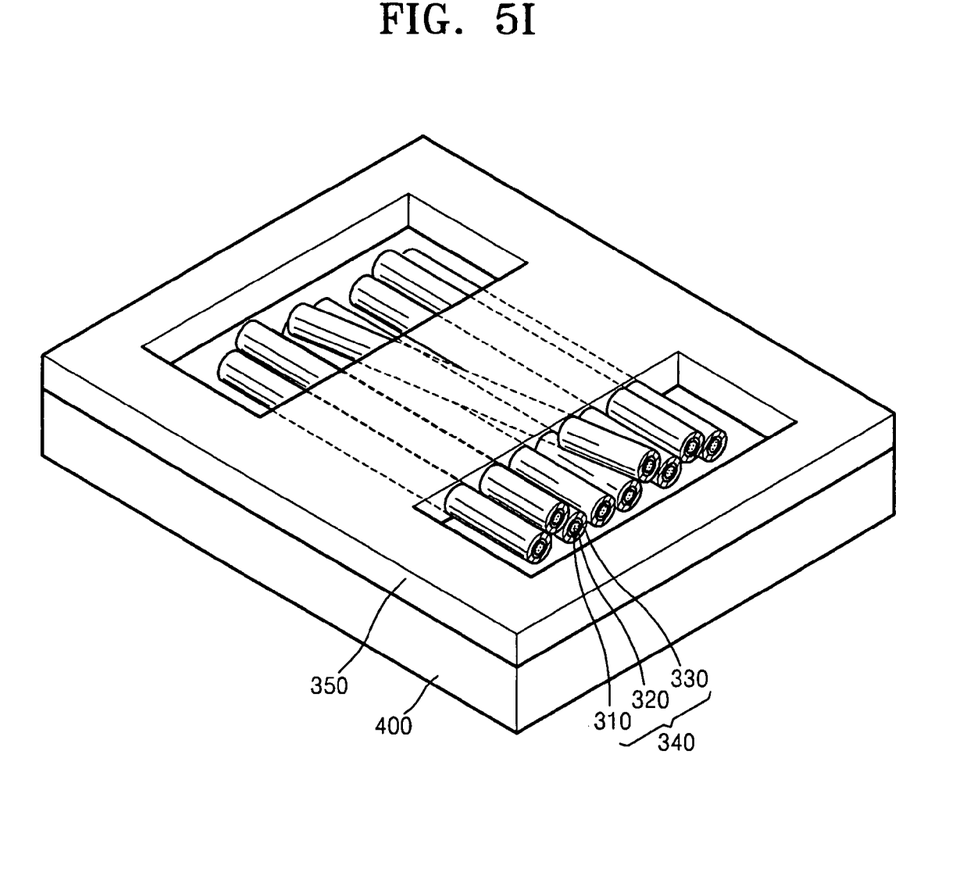
Figure 5J:
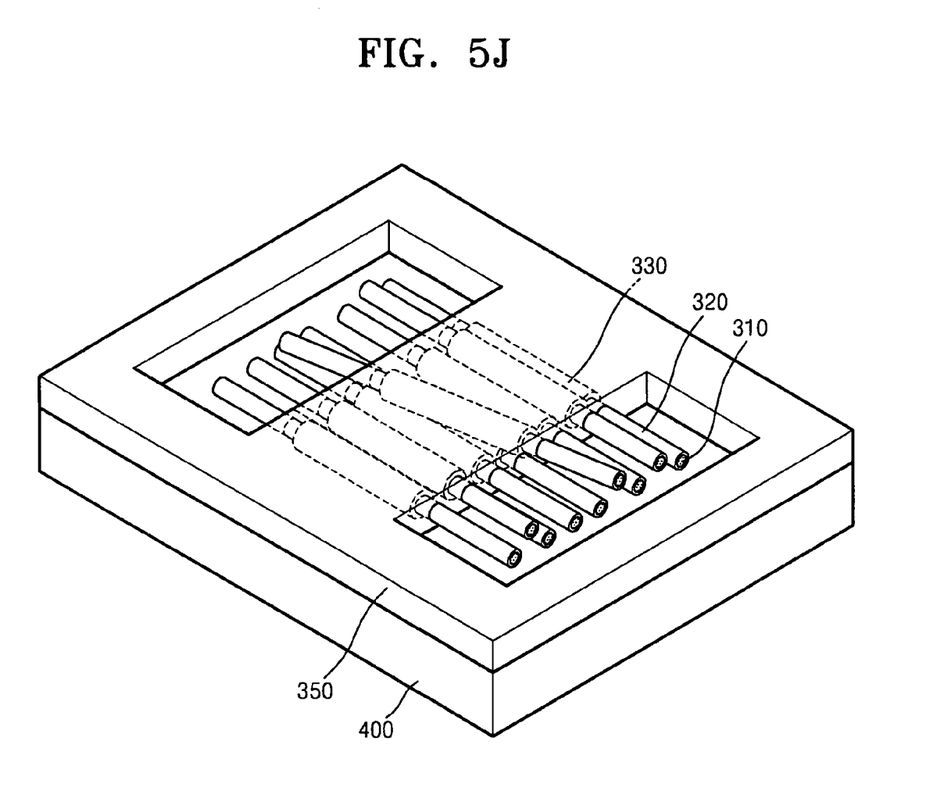
Figure 5K:
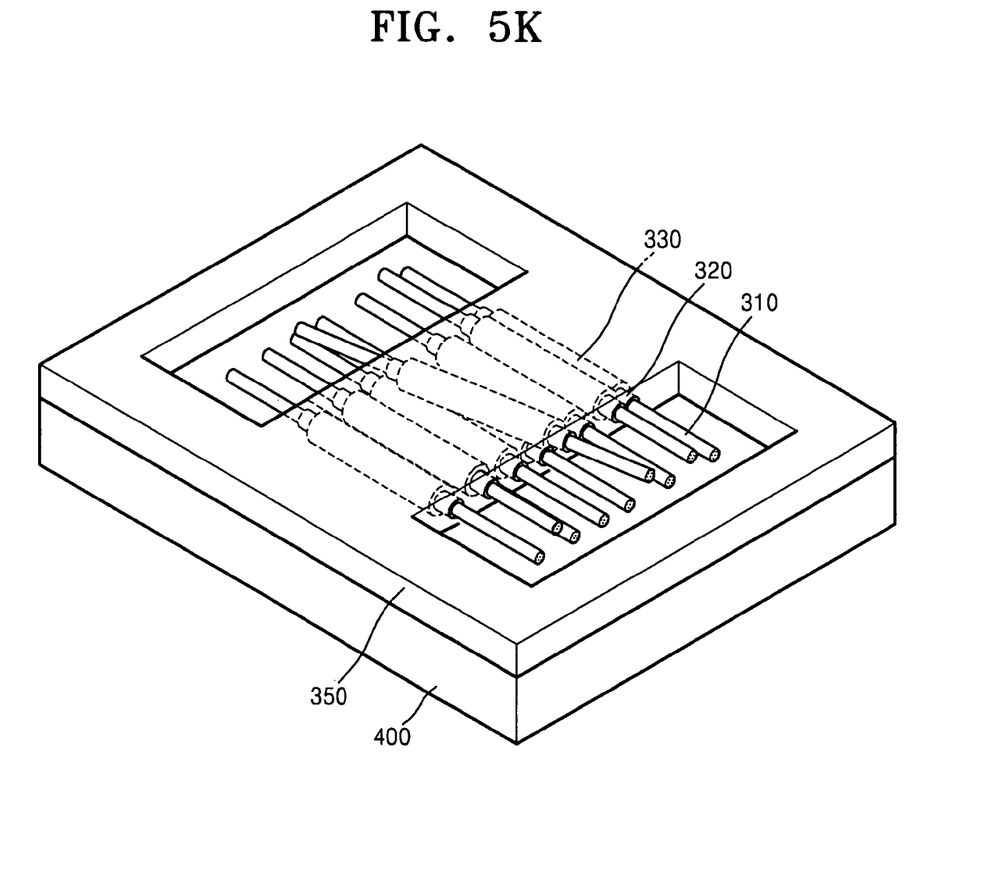
Figure 5L:
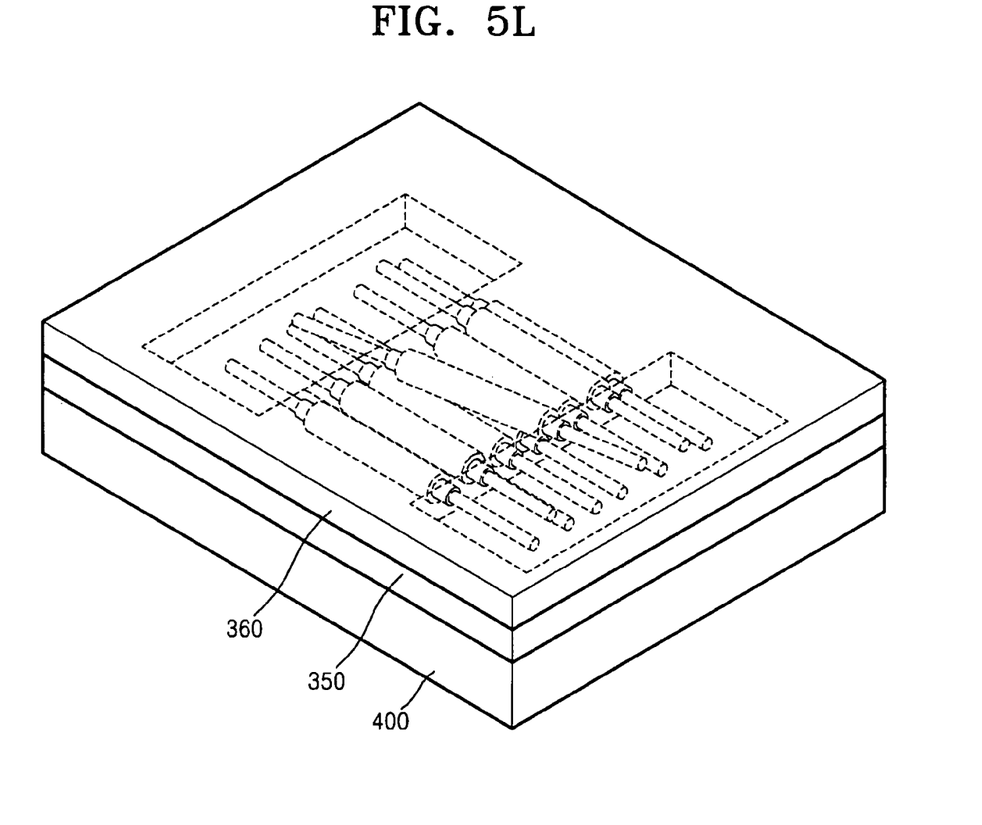
Figure 5M:
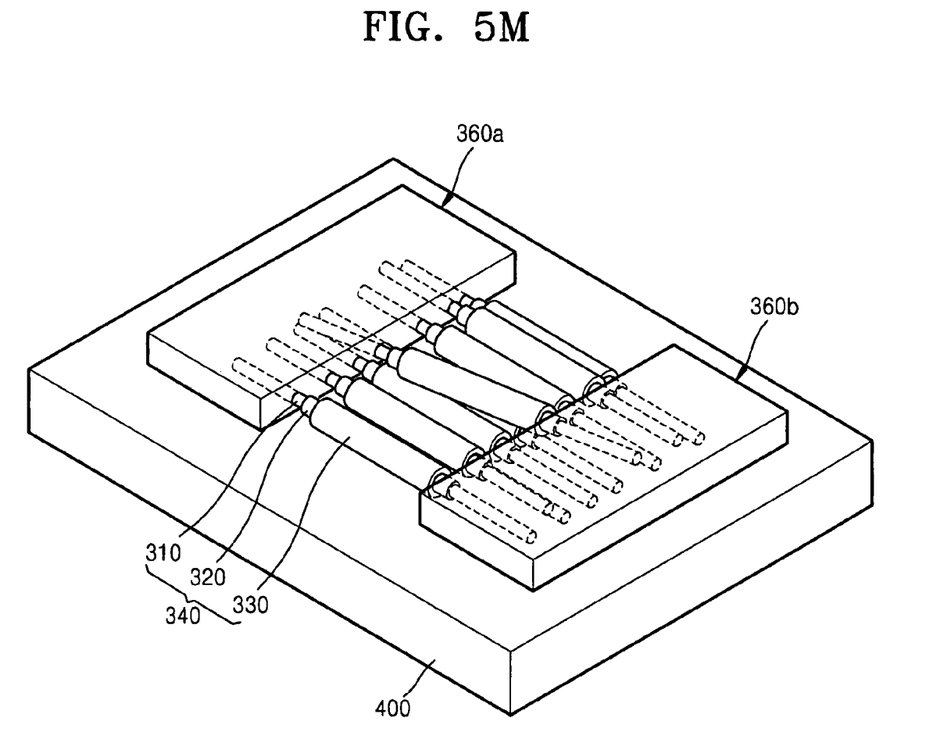
Figure 5N:
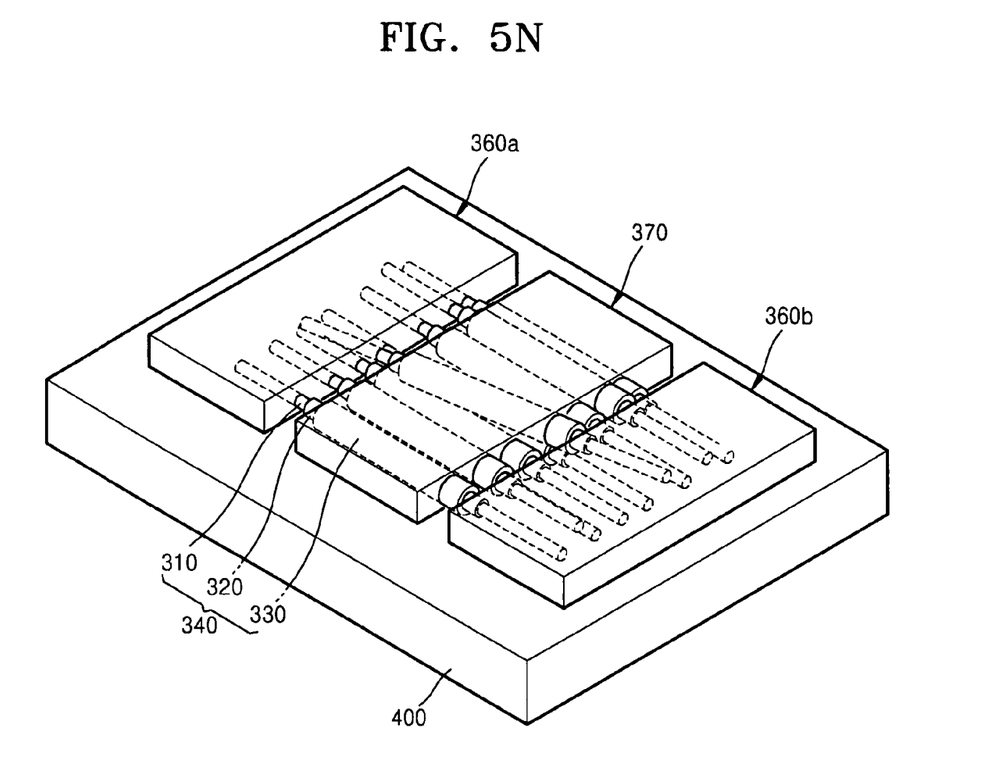

FIGS. 5A thru 5N illustrate a method of manufacturing a transistor according to an embodiment of the present invention. Specifically, FIGS. 5A thru 5F are cross-sectional views, and FIGS. 5G thru 5N are perspective views.

Referring to FIG. 5A, a plurality of vertical channel layers 310 separated from each other are formed on a first substrate 300. The vertical channel layers 310 can be formed using one of two methods as follows. First, a plurality of vertical channel layers 310 can be obtained by forming a photosensitive layer pattern on the first substrate 300 having a single crystal structure, and then etching the first substrate 300 using the photosensitive layer pattern as an etching mask. The first substrate 300 maybe etched using a dry or wet etching method. The wet etching method used here is an anisotropic etching method using the difference of etching rates depending on the crystal surface of the first substrate 300. For example, if the first substrate 300 is a silicon substrate, and a lateral surface of the first substrate 300 has a higher density than that of an upper surface of the first substrate 300, the first substrate 300 can be wet-etched only in a direction perpendicular to the upper surface of the first substrate 300. The etching solution for the wet etching method may be KOH, tetramethyl ammonium hydroxide (TMAH) or ethylene diamine pyrochatechol (EPD). Accordingly, when the vertical channel layers 310 are formed by etching, the widths of the vertical channel layers 310 and the intervals therebetween can be easily controlled by controlling the widths of patterns in the photosensitive layer pattern and the intervals therebetween. Also, the shape of the vertical channel layers 310 can be modified in various ways by varying the shape of the photosensitive layer pattern. For example, the vertical channel layers 310 may be circular cylindrical, square cylindrical, or planar. In the second method, the vertical channel layers 310 can be formed on the first substrate 300 using a single crystal growth method.

In detail, a mold insulating layer having a plurality of opening portions is formed on the first substrate 300, and a predetermined single crystal layer can be grown from lower surfaces of the opening portions. Alternatively, a patterned metal seed layer may be formed on the first substrate 300, and a predetermined single crystal layer can be grown from the metal seed layer.

Various types of single crystal layers can be formed using the above-described methods. For example, the vertical channel layers 310 can be formed of carbon nanotubes (CNT), Si, ZnO, GaN, GaP, or InP.

Referring to FIG. 5B, an oxide layer 315 is formed by oxidizing surfaces of the vertical channel layers 310 and the first substrate 300. Then the oxide layer 315 is removed using a wet etching method. FIG. 5C illustrates the resultant structure after the removal of the oxide layer 315.

The oxide layer 315 is removed after being formed for the following reasons. If the vertical channel layers 310 are formed using a dry etching method, the surfaces of the vertical channel layers 310 may be damaged by plasma. The damaged surfaces of the vertical channel layers 310 may adversely affect transistor characteristics. When the oxide layer 315 is formed and then removed, a layer damaged by the dry etching process can be removed. In addition, by forming and removing the oxide layer 315, the diameter (or thickness) of the vertical channel layers 310 can be reduced. Thus, vertical channel layers 310 having minute widths which are difficult to realize using a conventional exposure process can be obtained by forming and removing the oxide layer 315. However, the process of forming and removing the oxide layer 315 illustrated in FIGS. 5B and 5C is optional.

Referring to FIG. 5D, a gate insulating layer 320 is formed on surfaces of the first substrate 300 and the vertical channel layers 310. The gate insulating layer 320 can be formed using a thermal oxidization method requiring a high temperature process or using a chemical vapor deposition (CVD) method, a plasma enhanced-CVD (PE-CVD) method or an atomic layer deposition (ALD) method. Since the first substrate 300 may be a single crystal semiconductor substrate having high resistance to a high-temperature process, various types of gate insulating layers 320 can be formed without limitations due to the high-temperature process temperature. For example, the gate insulating layer 320 may be formed of $SiO_x$, $Si_xN_y$, or a high-k dielectric material having a greater dielectric constant than $Si_xN_y$, for example, $Ta_xO_y$, BaSrTiO(BST)-based material or PbZrTiO(PZT)-based material. As a high-k dielectric material layer can be easily applied as the gate insulating layer 320 in the present invention, the characteristics of the device can be improved.

Referring to FIG. 5E, a gate electrode 330 is formed on the gate insulating layer 320. The gate electrode 330 may be formed of at least one of metal and polysilicon.

The vertical channel layers 310, the gate insulating layer 320, and the gate electrode 330 constitute vertical structures 340.

Referring to FIG. 5F, the vertical structures 340 are separated from the first substrate 300 using a blade 500. The vertical structures 340 may also be separated using other methods. For example, the vertical structures 340 may be separated from the first substrate 300 by vibrating the vertical structures 340 using an ultra-sonic generator. Also, the vertical structures 340 may be separated from the first substrate 300 by exposing an upper surface of the first substrate 300 by anisotropically etching the gate electrodes 330 and the gate insulating layers 320, and then etching the upper surface of the first substrate 300. FIG. 5G illustrates the vertical structures 340 separated from the first substrate 300.

Referring to FIG. 5H, the vertical structures 340 are laid on a second substrate 400. The second substrate 400 may be a glass substrate or a plastic substrate, and according to circumstances, may also be a semiconductor substrate such as a silicon substrate. If the second substrate 400 is a glass substrate, a device having good light transmissivity can be realized. If the second substrate 400 is a plastic substrate, a flexible device can be realized.

Hereinafter, the process of depositing the vertical structures 340 on the second substrate 400 will be described in more detail. The vertical structures 340 may be floated in a predetermined solvent and arranged in a predetermined structure. Prior to the latter step, the second substrate 400 may be submerged in the solvent. By slowly raising the second substrate 400 or removing the solvent through a discharge outlet, the vertical structures 340 can be deposited on the upper surface of the second substrate 400. Various methods of depositing the vertical structures 340 may be used. For example, as the vertical structures 340 are floated in the solvent, the upper surface of the second substrate 400 may be closely adhered to the vertical structures 340 from the upper direction of the solvent. Alternatively, the vertical structures 340 may be floated in the solvent, and the solvent containing the vertical structures 340 is then poured onto the second substrate 400 so as to deposit the vertical structures 340 on the second substrate 400. Alternatively, the vertical structures 340 may be directly deposited on the second substrate 400 without using a solvent. The vertical structures 340 deposited in this manner may have a single-layer structure or a multi-layer structure.

Referring to FIG. 5I, a mask layer 350 exposing both ends of the vertical structures 340 is formed on the second substrate 400 and the vertical structures 340. The mask layer 350 may be a photosensitive layer.

The mask layer 350 is used as an etching mask to etch portions of the gate electrodes 330 at both ends of the vertical structures 340. FIG. 5J illustrates the resultant structure after the etching of the portions of the gate electrodes 330 at both ends of the vertical structures 340. The gate electrodes 330 may be etched using a dry etching method or a wet etching method, and is preferably an isotropic etching method. Thus, the portions of the gate electrodes 330 under the mask layer 350 are under-cut.

Next, the mask layer 350 is used as an etching mask to etch portions of the gate insulating layers 320 at both ends of the vertical structures 340. FIG. 5K illustrates the resultant structure after the etching of the portions of the gate insulating layers 320 at both ends of the vertical structures 340. The gate insulating layers 320 may be etched using a dry etching method or a wet etching method, and is preferably an isotropic etching method. The portions of the gate insulating layers 320 under the mask layer 350 may be under-cut. The amount of under-cutting of the gate insulating layers 320 may be less than that of the gate electrodes 330.

Referring to FIG. 5L, a source/drain electrode layer 360 covering both ends of the vertical structures 340 is formed on the second substrate 400 and the mask layer 350. Since the portions of the gate electrodes 330 under the mask layer 350 are under-cut, the source/drain electrode layer 360 and the gate electrodes 330 do not contact each other.

Then, the mask layer 350 and the source/drain electrode layer 360 on the mask layer 350 are removed using a lift-off method. Alternatively, the mask layer 350 may be removed after chemical and mechanical polishing (CMP) the source/drain electrode layer 360 until the mask layer 350 is exposed. As a result, as illustrated in FIG. 5M, a source electrode 360a covering an end of the vertical structures 340 and a drain electrode 360b covering another end of the vertical structures 340 are formed on the second substrate 400.

Referring to FIG. 5N, a contact electrode 370 is formed on the portion of the second substrate 400 between the source electrode 360a and the drain electrode 360b, thereby contacting the gate electrodes 330 on the vertical structures 340. The contact electrode 370 may cover a portion or all of each of the gate electrodes 330.

Although not illustrated in the drawings, the contact electrode 370 maybe formed under the vertical structures 340. Then, in the operation described with reference to FIG. 5H, after forming the contact electrode 370 on the second substrate 400, the vertical structures 340 are deposited on the contact electrode 370 and the second substrate 400. Except for the time at which the contact electrode 370 is formed, the method of manufacturing the transistor may be the same as described above.

As described above, the channel layers 310 between the source and drain electrodes 360a and 360b, respectively, are coated with the gate insulating layer 320 and the gate electrode 330 in the transistor according to the current embodiment of the present invention. Therefore, an identical gate electric field can be applied to the entire region of the channel layers 310, and thus all of the channel layers 310 can be simultaneously turned on, thereby increasing the volume of effective channels. Accordingly, according to the current embodiment of the present invention, a transistor having good switching characteristics can be realized.

Since the gate insulating layer 320 is formed on the first substrate 300 having high resistance to a high-temperature process, a gate insulating layer 320 having superior quality can be formed without process limitations. Accordingly, improvement of transistor characteristics by improving the characteristics of the gate insulating layer 320 can be expected.

According to the present invention, vertical channel layers 310 having a uniform width and uniform intervals therebetween can be easily formed by etching, thereby improving the uniformity of characteristics of the device.

While the present invention has been particularly shown and described with reference to exemplary embodiments thereof, the exemplary embodiments should be considered in a descriptive sense only and not for purposes of limitation. For example, it will be understood by those of ordinary skill in the art that the elements and structure of the transistor of the present invention are not limited to those described above.

The transistor according to the present invention may be applied not only to liquid crystal display devices and organic light emitting display devices but also to light emitting devices, memory devices, logic elements, and so on. Therefore, the scope of the invention is defined not by the detailed description of the invention but by the appended claims.

What is claimed is:

1. A method of manufacturing a transistor, comprising the steps of:
    forming a vertical channel layer on a first substrate;
    sequentially forming a gate insulating layer and a gate electrode on a surface of the vertical channel layer so as to form a vertical structure comprising the vertical channel layer, the gate insulating layer, and the gate electrode;
    separating the vertical structure from the first substrate;
    laying the vertical structure lengthwise on a second substrate forming a mask layer exposing both ends of the vertical structure on the second substrate;
    sequentially removing portions of the gate electrode and the gate insulating layer from both ends of the exposed vertical structure; and
    forming a source electrode and a drain electrode contacting respective ends of the vertical structure.

2. The method of claim 1, wherein the first substrate is a semiconductor substrate having a single crystal structure.

3. The method of claim 1, wherein the vertical channel layer is formed by etching the first substrate.

4. The method of claim 1, wherein the vertical channel layer is formed using a single crystal growth method.

5. The method of claim 1, wherein the vertical channel layer is one of a carbon nano tube (CNT) layer, a Si layer, a ZnO layer, a GaN layer, a GaP layer, and an InP layer.

6. The method of claim 1, wherein the channel layer is one of cylindrical, hexagonal, and planar in shape.

7. The method of claim 1, wherein a plurality of vertical layers identical to the vertical layer are formed, and the gate insulating layer and the gate electrode sequentially surround the vertical channel layers.

8. The method of claim 1, further comprising the step of reducing one of a diameter and a thickness of the vertical channel layer before forming the gate insulating layer.

9. The method of claim 8, wherein the step of reducing one of a diameter and a thickness of the vertical channel layer comprises:
    forming an oxide layer by oxidizing a surface of the vertical channel layer; and
    removing the oxide layer.

10. The method of claim 1, wherein the gate insulating layer is formed of one of $SiO_x$, $Si_xN_y$, and a material having a greater dielectric constant than $Si_xN_y$.

11. The method of claim 1, wherein the second substrate is one of a glass substrate, a plastic substrate, and a semiconductor substrate.

12. The method of claim 1, wherein a plurality of vertical structures identical to the vertical structure are laid on the second substrate.

13. The method of claim 12, wherein the vertical structures are arranged on the second substrate in one of a single-layer structure and a multi-layer structure.

14. The method of claim 1, wherein, when removing the gate electrode from both ends of the vertical structure, a portion of the gate electrode under the mask layer is undercut.

15. The method of claim 1, wherein the step of forming a source electrode and a drain electrode comprises:
    forming a source/drain electrode layer on the second substrate and the mask layer so as to cover both ends of the vertical structure; and
    removing the mask layer and the source/drain electrode layer on the mask layer.

16. The method of claim 1, wherein the step of forming a source electrode and a drain electrode comprises:
    forming a source/drain electrode layer on the second substrate and the mask layer so as to cover both ends of the vertical structure;
    polishing the source/drain electrode layer until the mask layer is exposed; and
    removing the mask layer.

17. The method of claim 1, wherein a contact electrode contacting the gate electrode is further formed on the second substrate.

18. The method of claim 17, wherein the contact electrode is formed on the gate electrode.

19. The method of claim 17, wherein the contact electrode is formed under the gate electrode.

* * * * *